(12) United States Patent
Barabash et al.

(10) Patent No.: US 9,105,704 B2
(45) Date of Patent: Aug. 11, 2015

(54) METHOD OF DEPOSITING FILMS WITH NARROW-BAND CONDUCTIVE PROPERTIES

(71) Applicant: Intermolecular, Inc., San Jose, CA (US)

(72) Inventors: Sergey Barabash, San Jose, CA (US); Dipankar Pramanik, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 287 days.

(21) Appl. No.: 13/722,931

(22) Filed: Dec. 20, 2012

(65) Prior Publication Data

US 2014/0175567 A1 Jun. 26, 2014

(51) Int. Cl.
*H01L 21/3065* (2006.01)
*H01L 29/78* (2006.01)
*H01L 21/3105* (2006.01)
*H01L 21/28* (2006.01)
*H01L 21/768* (2006.01)

(52) U.S. Cl.
CPC .......... *H01L 29/78* (2013.01); *H01L 21/28255* (2013.01); *H01L 21/3105* (2013.01); *H01L 21/76823* (2013.01); *H01L 21/76826* (2013.01)

(58) Field of Classification Search
CPC ...................... H01L 21/3105; H01L 21/28255; H01L 21/76826; H01L 21/76823
See application file for complete search history.

(56) References Cited

U.S. PATENT DOCUMENTS

| 5,383,088 | A | 1/1995 | Chapple-Sokol et al. |
| 6,965,137 | B2 | 11/2005 | Kinney et al. |
| 7,008,872 | B2 | 3/2006 | Dubin et al. |
| 7,067,862 | B2 | 6/2006 | Rinerson et al. |
| 2006/0171200 | A1 | 8/2006 | Rinerson et al. |
| 2006/0172554 | A1* | 8/2006 | Wang et al. .................... 438/787 |
| 2008/0029807 | A1* | 2/2008 | Miyazaki et al. ............. 257/316 |

FOREIGN PATENT DOCUMENTS

CN 101071843 A 11/2007

OTHER PUBLICATIONS

Kim, D.C., et al.; Electrical Observations of Filamentary Conductions for the Resistive Memory Switching in NiO Films; May 15, 2006; American Institute of Physics; Applied Physics Letters; pp. 202102-1-202102-3.
Kim, Y.M., et al.; Characteristics of Atomic Layer Deposition Grown HfO2 Films After Exposure to Plasma Treatments; Oct. 16, 2006; Elsevier; Thin Solid Films; pp. 2984-2989.
Watson et al.; Destruction of Superconductivity in the Narrow-Band Metal K3C60; Feb. 1, 1997; Physical Review B, vol. 55, No. 6; The American Physical Society; pp. 3866-3869.
Han et al.; Impurity Doping in SiO2: Formation Energies and Defect Levels from First-Principles Calculations; Oct. 22, 2010; Physical Review B; The American Physical Society; pp. 155132-1-155132-7.

(Continued)

Primary Examiner — Caleb Henry
Assistant Examiner — Mounir Amer

(57) ABSTRACT

Conducting materials having narrow impurity conduction bands can reduce the number of high energy excitations, and can be prepared by a sequence of plasma treatments. For example, a dielectric layer can be exposed to a first plasma ambient to form vacancy sites, and the vacancy-formed dielectric layer can be subsequently exposed to a second plasma ambient to fill the vacancy sites with substitutional impurities.

18 Claims, 6 Drawing Sheets

(56) References Cited

OTHER PUBLICATIONS

Madou et al.; The Silicon/Silica Electrode; Nov. 28, 1979; Physica Status Solidi; pp. 705-712.
Medvedeva et al.; Combining High Conductivity With Complete Optical Transparency: A band structure approach; Jan. 19, 2005; Europhysics Letters; EDP Sciences; pp. 583-587.
Hsu et al.; Band Structure of Metallic Pyrochlore Ruthenates $Bi_2Ru_2O_7$ and $Pb_2Ru_2O_{6.5}$; Mar. 7, 1988; Applied Physics Letters, vol. 52, No. 10; American Institute of Physics; pp. 792-794.
Khachaturov et al.; Electron Tunneling into a Narrow Band Conductor; Jan. 2003; Journal of the Physical Society of Japan, vol. 72, No. 1; The Physical Society of Japan; pp. 131-134.

\* cited by examiner

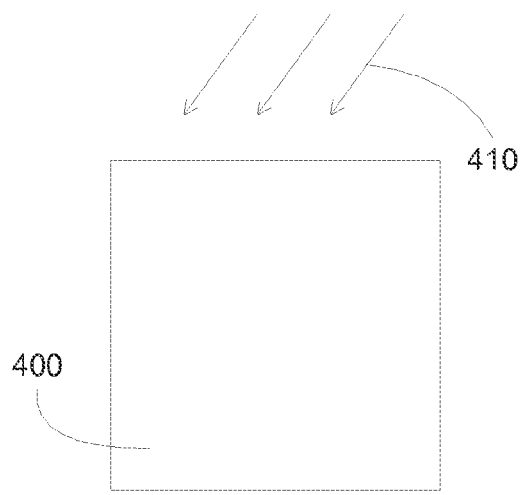
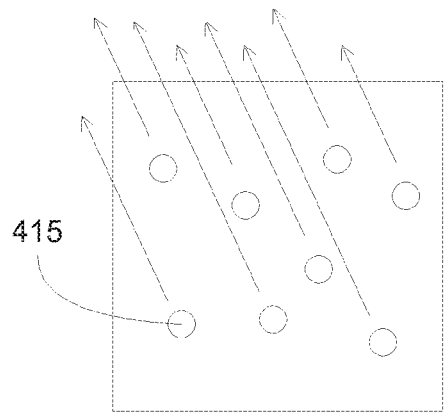
FIG. 4A  FIG. 4B
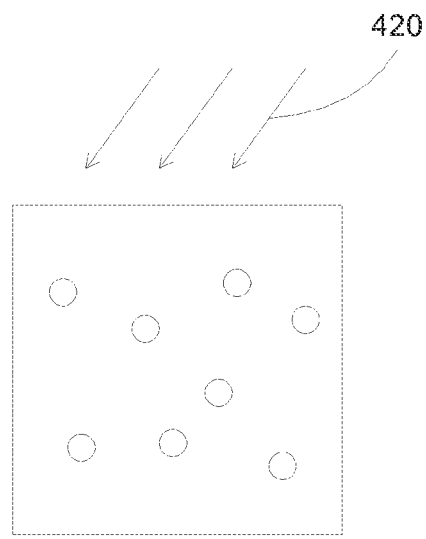
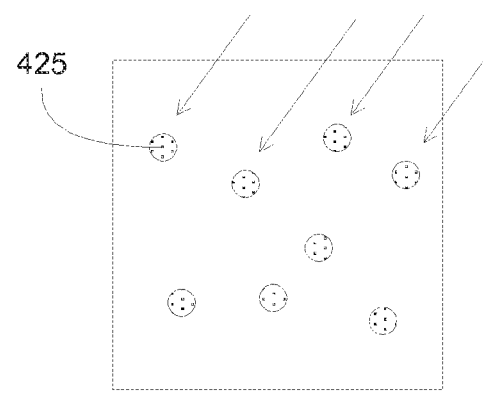
FIG. 4C  FIG. 4D

```
┌─────────────────────────────────────────────┐
│   Providing a dielectric layer on a substrate,│
│ wherein the dielectric layer comprises covalently bonded │
│              dielectric material            │
│                     500                     │
└─────────────────────────────────────────────┘
                      │
                      ▼
┌─────────────────────────────────────────────┐
│ Exposing the dielectric layer to a first plasma ambient, │
│   wherein the first plasma ambient comprises power │
│  configured to break the covalent bonds of the dielectric │
│                     layer,                  │
│  wherein the first plasma ambient is configured to enable │
│     the removal of atoms by at least 1 at%, │
│  wherein the first plasma ambient is configured to not │
│       enabling the dielectric layer to restructured │
│                     510                     │
└─────────────────────────────────────────────┘
                      │
                      ▼
┌─────────────────────────────────────────────┐
│ Exposing the dielectric layer to a second plasma ambient, │
│   wherein the second plasma ambient comprises plasma │
│    ions which enable the captured of ions by the vacancy │
│     generated by the removal of the atoms due to the │
│            exposure to the first plasma ambient, │
│   wherein the second plasma ambient is configured to │
│       enable the captured of ions by at least 1 at%, │
│   wherein the second plasma ambient comprises power │
│   which is configured to not enabling self diffusion of the │
│                  captured ions              │
│                     520                     │
└─────────────────────────────────────────────┘
```

FIG. 5

METHOD OF DEPOSITING FILMS WITH NARROW-BAND CONDUCTIVE PROPERTIES

TECHNICAL FIELD

Provided are methods of forming conducting materials, and more particularly to methods of forming conducting materials having narrow conduction impurity band.

BACKGROUND

Aluminum or copper have been widely used as a material of a wiring conductor for semiconductor devices including ICs (integrated circuits) and VLSIs (very large scaled integrated circuits). However, aluminum, copper, and other typical conductive metals can have very wide conduction bands, e.g., in order of 5 eV, and thus possess a large number of high energy electronic excitations, e.g., excitations with energies far from the Fermi level, which can be detrimental in certain situations in electronic applications.

Therefore, what are needed are conductors with narrow conduction band, which can minimize excited energy deviation.

SUMMARY

In some embodiments, methods to deposit a conducting material with a narrow impurity band are provided. The narrow impurity band can be at the energy far from the main conduction and valence bands and close to the range of energies of the Fermi levels in metallic contacts with typical work function values. The resulting material can be made metallic, but the impurity band is much narrower than typical metals.

In some embodiments, methods, and conductive thin film materials fabricated from the methods, are provided that can include providing a dielectric layer, exposing the dielectric layer to a first plasma ambient to form vacancy sites in the dielectric layer, and exposing the vacancy-formed dielectric layer to a second plasma ambient to fill the vacancy sites with substitutional impurities. The methods can be performed at low temperature and/or short time to generate a large number of substitutional deep defects.

In some embodiments, additional doping can be performed to ensure that the band is partially filled. The additional doping can include adding dopant into the second plasma exposure. In some embodiments, the dielectric layer can be prevented from undergoing a substantial change in atomic structure and topology of chemical bonding (beyond the intended formation of vacancies and/or substitutional impurities) during and after each exposure to the plasma ambient, particularly between the consecutive exposures. For example, the material can be kept at a temperature below the temperature at which there is substantial self-diffusion. Thus the material does not re-bind to change the local atomic coordination, thereby passivating/compensating the electrical signature of the generated impurities. In some embodiments, multiple layers can be fabricated to achieve a desired thickness.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIGS. 4A-4D illustrate an illustrative sequence to form a narrow conduction band in a dielectric material according to some embodiments.

FIG. 5 illustrates a process flowchart for forming a conductive material having narrow conduction band according to some embodiments.

DETAILED DESCRIPTION

Figure 1:
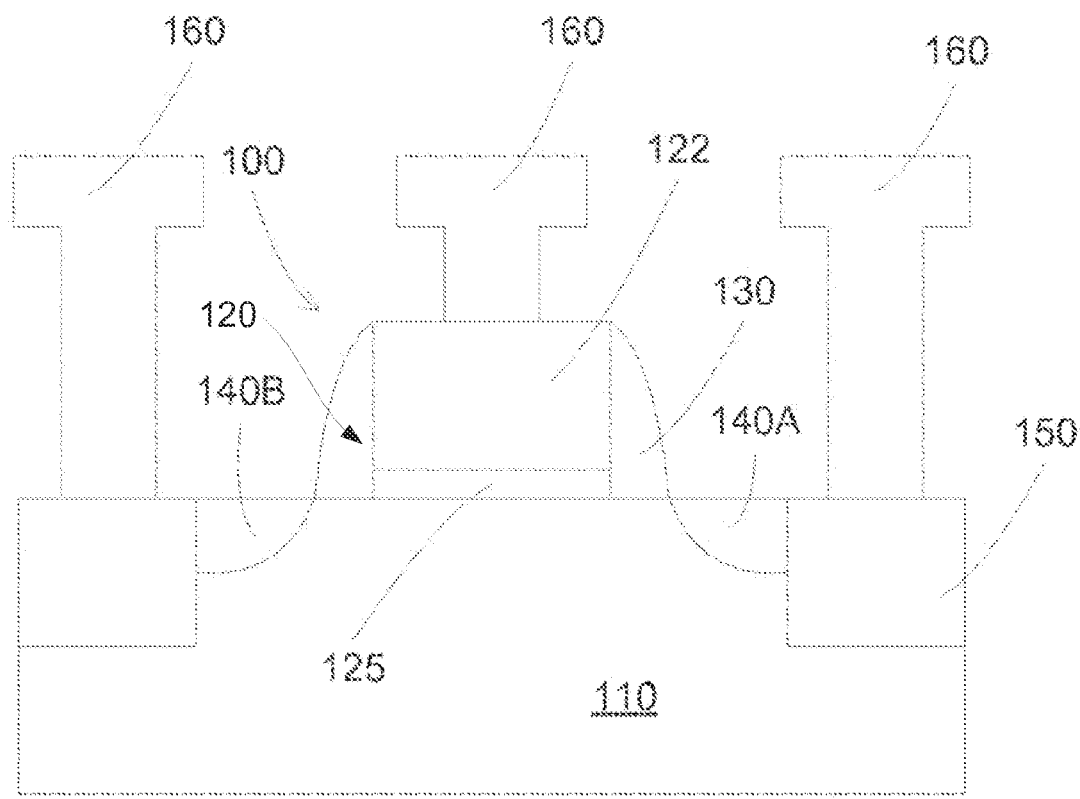
FIG. 1 illustrates an illustrative semiconductor device according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, methods and devices having conductors with improved characteristics are provided. The conductors with improved characteristics can offer less energy deviation of conduction electrons from the local Fermi level, for example, due to thermal excitation. Typical conductors, such as common metals, can have very wide conduction bands, in order of 5 eV, and thus possess a large number of high energy excitations, e.g., excitations with energies far from the Fermi level, which can be detrimental in certain situations in electronic applications.

In some embodiments, methods, and devices fabricated from the methods, are provided to form a conducting material with a narrow impurity band. The narrow impurity band can be at the energy far from the main conduction and valence bands and close to the range of energies of the Fermi levels in metallic contacts with typical work function values. The resulting material can be made metallic, but the impurity band is much narrower than typical metals. In addition, narrow band conductors can possess a number of special properties, which can be used for specific applications such as photovoltaic.

In some embodiments, methods, and conductive thin film materials fabricated from the methods, that can convert a dielectric material to a conducting material with narrow conductor band. The methods can include generating high concentration of substitutional impurities in the dielectric material. The high concentration of impurities can lead to an impurity band, which offers conduction property similar to that of a metal, but with much narrower variation in excitation energies. The substitutional impurities can be generated by creating a corresponding number of vacancies in the thin film, for example, by removing atoms by ion bombardment, and by introducing impurities into the vacancies. The process can be performed at temperature and time scales that minimize relaxation or self diffusion, to prevent the atoms from restructuring or rebinding during the vacancy formation and to prevent the impurities from diffusing throughout the thin film layer during the capturing of impurities by the vacancy sites. The impurity concentration can be between 0.5 at % and 10 at %, such as between 0.5 and 3 at %.

FIG. 1 illustrates an illustrative semiconductor device according to some embodiments. A transistor structure 100 is formed on a substrate 110, including isolation regions 150 to isolate the neighboring devices, source and drain regions 140A and 140B sandwiching a gate electrode 120 including a gate dielectric 125 and a gate conductor 122. Spacers 130 cover the sidewalls of the gate electrode 120. The substrate 110 can be a semiconductor substrate, or any substrates having a layer of semiconductor material. For example, the substrate 110 can be a single crystal silicon substrate. The substrate 110 can be a silicon-germanium substrate, or can have a silicon germanium layer disposed on top. The gate conductor 122 can include doped polysilicon or metal. Metal interconnect 160 can be formed for connecting the gate electrode, and the source and drain regions. FIG. 1 shows an example of a metal-oxide-semiconductor field effect transistor (MOSFET) structure 100, but the invention is not so limited, and can include any transistor structure, such as bipolar transistors, fin transistors or double gate transistors. In addition, support structures and devices can also be included, such as silicidation.

Figure 2A:
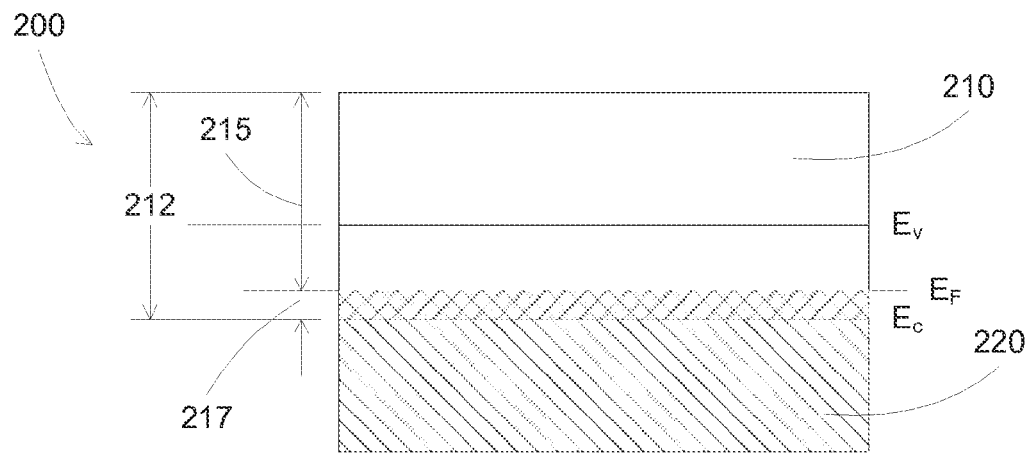
FIGS. 2A-2D illustrate illustrative energy band schematics for different materials according to some embodiments.

FIGS. 2A-2D illustrate illustrative energy band schematics for a metal, a doped semiconductor, and an insulator, according to some embodiments. In FIG. 2A, a metal 200, such as the gate conductor 122, or the metal interconnect 160, has a Fermi level $E_F$ crossing a partially filled conduction band 210. The band is partially filled because the equilibrium electron count is insufficient to fill it completely. In equilibrium at zero temperature, the states below the Fermi level, i.e. in the portion 217 of the band 210, are fully occupied, whereas the states above the Fermi level, i.e. in the portion 215 of the band 210, are unoccupied but available. The partial occupation of the conduction band 210 allows high conductivity, due to the free redistribution of charges between the occupied and unoccupied portions of the conduction band. The band width 230 of the conduction band 210 can be large, e.g., between 3 and 6 eV, leading to large fluctuation in energy levels of the conduction charges, for example, due to thermal excitation.

Figure 2B:
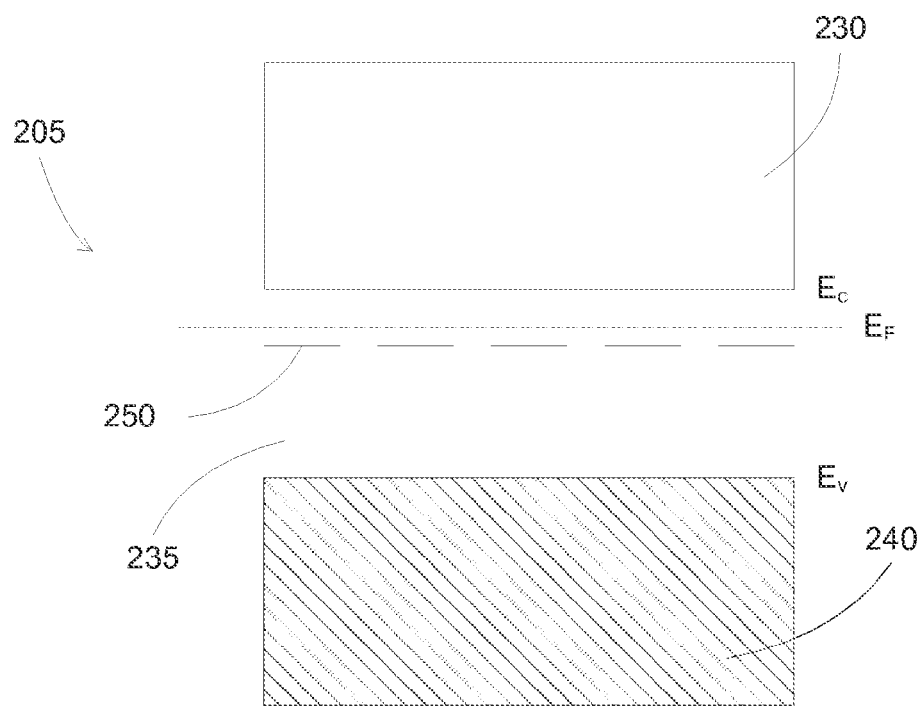

In FIG. 2B, a doped semiconductor material, such as an n-doped silicon 205, can have a conduction band 230 separated from a valence band 240 by a band gap 235. The silicon material 205 can be doped with an n-type impurity, such as phosphorous, which can create impurity levels 250 near the conduction band. In undoped or moderately doped semiconductor, the Fermi level $E_F$ can be in the gap, i.e. below the conduction band and above the valence band; this is called non-degenerate doping. In non-degenerately doped semiconductor, the valence band can be fully occupied, and the conduction band can be fully unoccupied, except due to the presence of thermal excitations. Negatively charged carriers, e.g., electrons, can jump from the impurity levels to the conduction band, increasing the conductivity of silicon. The energy levels of the electrons can have high deviations, for example, due to the thermal excitation of the electrons into the conduction band. Sometimes, charges can be similarly excited into the valence band (this is more typical for p-doped semiconductors). The Fermi level 245 can be separated from the nearest band (i.e. from the conduction band in FIG. 2B) by 0.0 ... 0.5 eV, whereas both the valence and the conductance bands can be quite wide (~2-6 eV), leading to a wide energy range of possible thermal excitations. Because of this wide range, excitations in semiconductor may appear similar to those in metals, however, unlike in metals, there can be only a limited number of impurity carriers available to create such excitations in semiconductors.

Figure 2C:
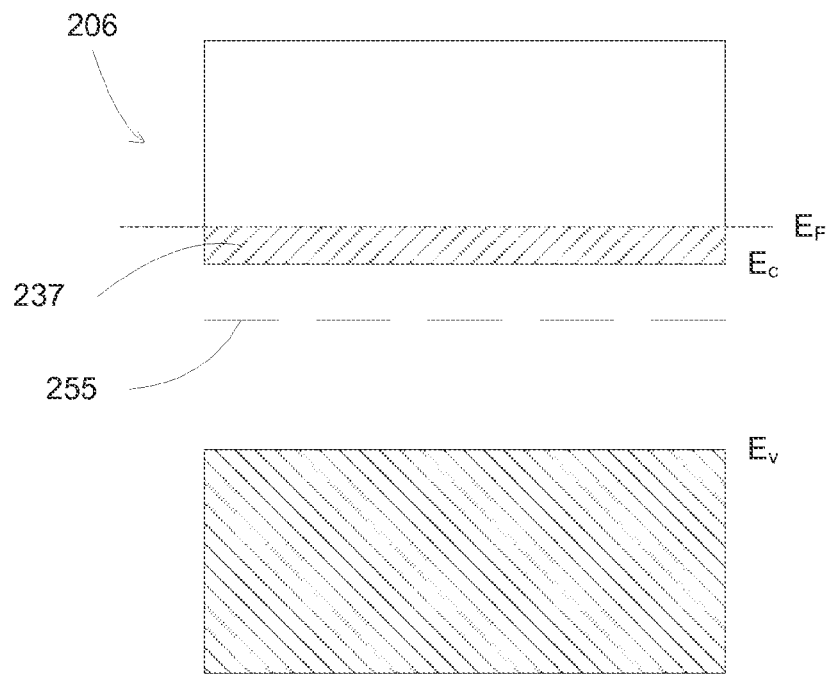

When the concentration of n-type dopant in semiconductor becomes substantial, or in the case of a dopant that creates impurity inside the conduction band, the Fermi level $E_F$ of an n-doped semiconductor 206 can fall into the conduction band 230 (FIG. 2C). Such semiconductors are said to be degenerately n-doped. Because the Fermi level then crosses the conduction band 230 and therefore the conduction band is partially filled, e.g., region 237, such a material can formally be considered a metal, cf. FIG. 2A. However, because the Fermi level is very close to the bottom of the conduction band, where the density of states is relatively low, the properties of degenerately doped semiconductors may be more similar to those of non-degenerately doped semiconductors than those of common metals. Similar to both metals and non-degenerate semiconductors, the degenerate semiconductors can exhibit a wide range of allowed energies for thermal excitations. In some embodiments, a semiconductor can be degenerately p-doped, so that the Fermi level falls into valence band, in which case the valence band becomes the partially filled band and formally plays the role of the conduction band in FIG. 2A.

Figure 2D:
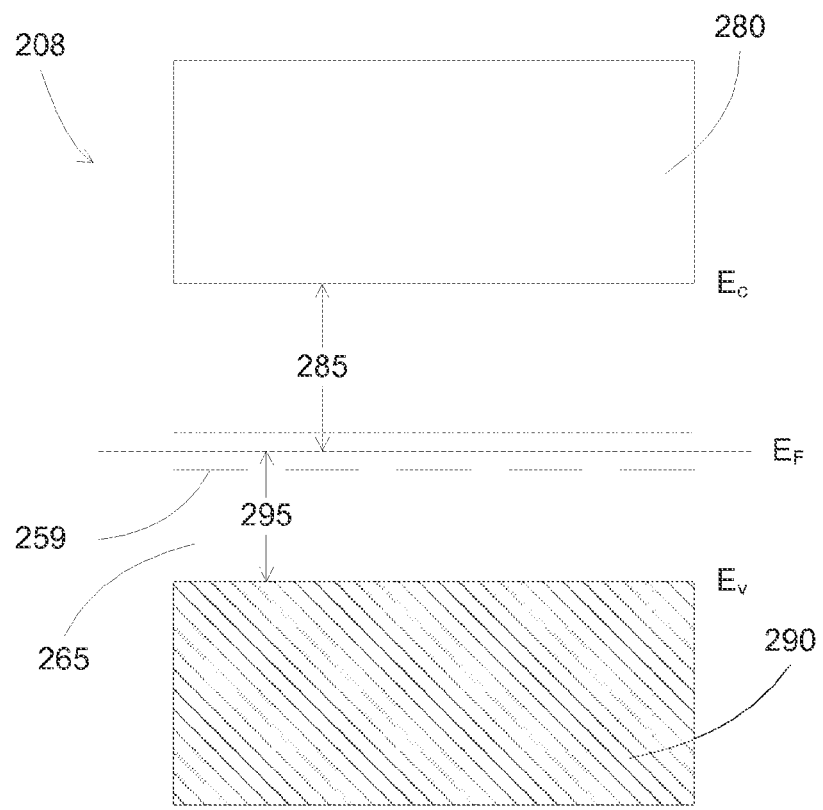

In FIG. 2D, an insulator material, such as $SiO_2$ 208, can have a conduction band 280 separated from a valence band 290 by a wide band gap 265. The Fermi level $E_F$ can typically lie deep inside the band gap. The valence band then can be fully occupied and the states in the conduction band can be fully unoccupied. The energy separation 285 of the Fermi level from the conduction band, as well as the energy separation 295 of the Fermi level from the valence band, can both be substantial, e.g. between 1 and 5 eV. The separations 285 and 295 can determine the minimal energy of available electron and hole excitations. Because these energies can be substantial, the number of thermal excitations can be negligible, and the charges may be unable to redistribute, resulting in insulating behavior.

The insulator material 208 in FIG. 2D can contain some impurities, such as hydrogen, which can create impurity levels 259. In typical insulators, such impurity levels can be separated from both the conduction and the valence band by 0.5 ... 3 eV or more, so that thermal excitations with low energy can be disallowed. Since thermal excitations with energy >0.5 eV have very small probability at typical semiconductor device operation temperatures, there may be very little redistribution of electrons to (from) the impurity levels from (to) the valence or conduction bands, resulting in very small conductivity.

In some embodiments, conductive materials, and methods that can fabricate the conductive materials, are provided that can have small energy fluctuation. For example, a conduction material having narrow impurity band can have energy restriction for the conducting charges.

In some embodiments, the conducting material can have an impurity band at the energy far from the main conduction and valence bands. The impurity band can be close to the range of energies of the Fermi levels in metallic contacts with typical work function values. The resulting material can be made metallic, but the impurity band can be much narrower than that of typical metals.

There may be different motivations to use such a material. Theoretical literature suggests that narrow-band conductors possess a number of special properties, some of which may have uses for specific applications (such as photovoltaic). For example, the existence of high-energy electronic excitations (i.e. those with energies far from the Fermi level) may be detrimental in a number of situations in electronics applications. Since typical metals have very wide conduction bands (usually ~5 eV), a large number of high-energy excitations can exist, which can decrease with excitation energy only as fast as the Fermi-Dirac distribution requires. In narrow-band conductors, high-energy electronic excitations are strongly suppressed.

The narrow impurity band far from the conduction and valence bands can have advantages over narrow impurity bands created just above the conduction band, or, less frequently, just below the valence band of many semiconductors and dielectrics. For example, impurity bands near the conduction band or the valence band can be usually very close to (or not at all separated from, as in the case of degenerately doped semiconductors) either the valence or the conduction band in dielectric materials, or can be relatively close (~1 eV) to both bands in semiconductor materials. When the impurity band is well-separated from either conduction or the valence band, spontaneous formation of compensating defects and/or poor matching to the work function of most metallic contacts puts a Fermi level away from such an impurity band, making the material nearly-insulating.

Figure 3A:
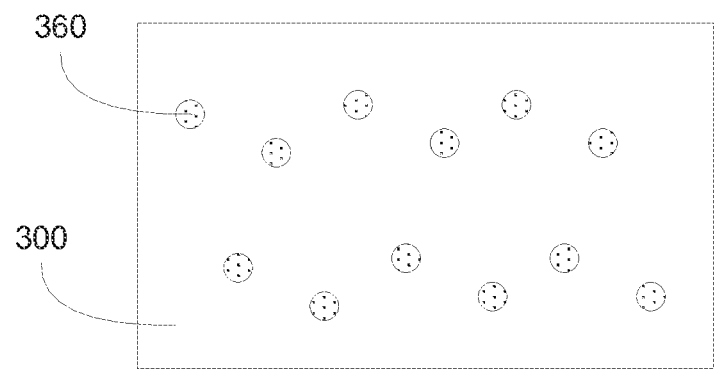
FIGS. 3A-3B illustrate a conducting material having a narrow conducting band according to some embodiments.
Figure 3B:
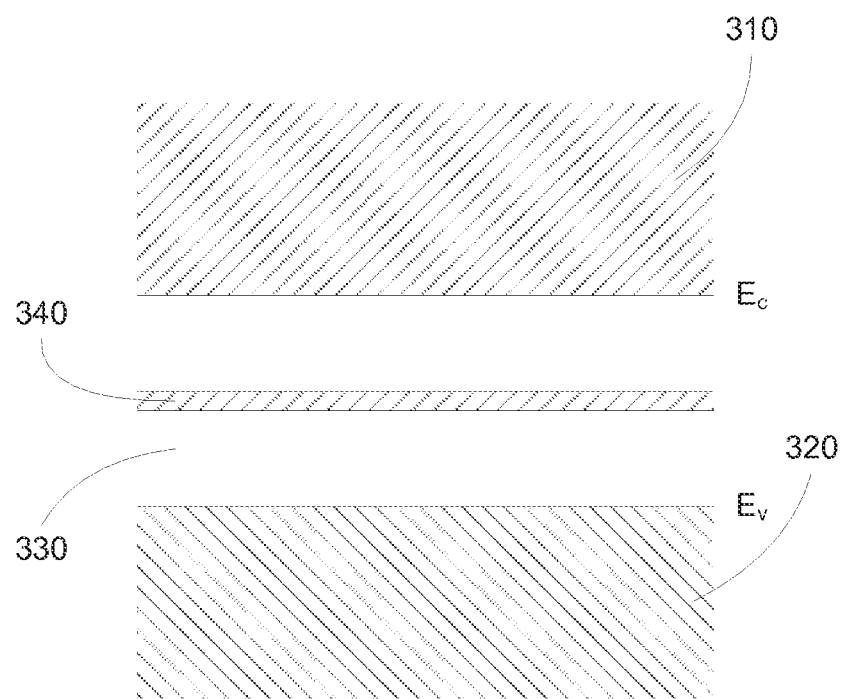

FIGS. 3A-3B illustrate a conducting material having a narrow conducting band according to some embodiments. In FIG. 3A, a dielectric material 300 can have embedded impurities 360. In FIG. 3B, an energy band diagram of the conducting material is shown, including a conduction band 310 and a valence band 320, separated by a band gap 330. A narrow impurity conduction band 340 can be present within the band gap, which can provide adequate charge conduction to make the material electrical conducting.

In some embodiments, the band gap 330 can be greater than 2 eV, such as greater than 3 or 4 eV. The large separation can prevent charge migration from the impurity band to either the conduction or the valence band.

In some embodiments, the dielectric material can include stoichiometric compounds, e.g., compounds having its component elements present in the exact proportions indicated by its formula. The stoichiometric material can have a clear coordination number, which is defined by the number of the available covalent bonds. For example, silicon in $SiO_2$ has 4 covalent bonds, bonding to oxygen atoms, and oxygen has 2 covalent bonds, bonding to nearby silicon. The dielectric forming process can be include deposition technique that can result in a material where this coordination number is reasonably uniformly achieved on a majority of sites, e.g., rather than creating a material in which the coordination number fluctuates from one atom to the other atom. For example, compounds with strong ionic bonding character (such as $TiO_2$ or $ZrO_2$), and deposition techniques creating a large number of mutually compensating defects, may require post deposition treatment to be suitable.

In some embodiments, the dielectric material can include silicon dioxide ($SiO_2$), for example, formed by oxidation of Si. The dielectric material can include covalently-bonded large-band dielectrics deposited by ALD. The impurity can include substitutional phosphorous or nitrogen on oxygen sites. The position of the impurity defect level is 3.7 eV and 4.0 eV, respectively, away from the valence band maximum, and over 5 eV away from the conduction band minimum of $SiO_2$. This is based on results calculated from first principles calculation, for example, see Han et al., Physical Review B 82, 155132 (2010).

In some embodiments, plasma treatments can be used to create the embedded impurities, e.g., the large number of deep defects, in a large band gap dielectric. For example, a dielectric layer can be exposed to a first plasma ambient to form vacancy sites in the dielectric layer, and the vacancy-formed dielectric layer can be subsequently exposed to a second plasma ambient to fill the vacancy sites with substitutional impurities. The methods can be performed at low temperature and/or short time to generate a large number of substitutional deep defects. The plasma treatments can include ions that can create an impurity level near the middle of the dielectrics band gap when substituted on low-coordinated sites. For example, in case of $SiO_2$ dielectric, the plasma ions can include nitrogen or phosphorous ions, which can create deep-lying defect levels on oxygen site, e.g., oxygen has coordination of 2 as compared to silicon having coordination of 4.

FIGS. 4A-4D illustrate a sequence to form a narrow conduction band in a dielectric material according to some embodiments. In FIG. 4A, a dielectric material 400 is exposed to a first plasma bombardment 410.

The first plasma exposure can include plasma ions which enable the generation of impurities within the dielectric band gap. The impurities can have levels near the middle of the dielectric band gap. As shown in FIG. 4B, the plasma exposure can remove atoms 415 from the dielectric layer 400.

The first plasma exposure can include a short pulse of low-intensity moderate-temperature plasma, with temperature greater or equal to ~50,000K. The first plasma ambient can include ions having kinetic energy greater than or equal to 5 eV. The first plasma ambient can include energy configured to break the covalent bonds of the dielectric layer. The plasma energy, e.g., temperature or kinetic energy, is chosen to be sufficient to break all the bonds of a site of the dielectric layer (such as the two Si—O bonds of the 2-coordinated O site in $SiO_2$) in a single collision with an appreciable probability.

The first plasma exposure can include low intensity or low ion density, for example, to keep the film temperature well below the temperature at which considerable self-diffusion can occur. For example, the first plasma ambient can include ion density less than or equal to $10^{-9}/cm^3$. The first plasma ambient can include ion density which is configured to not heating the dielectric layer to above one third of the melting temperature of the dielectric layer, During the first plasma exposure, the film substrate can be subject to ample cooling. In addition, the plasma intensity can be sufficiently low to prevent heating of the dielectric layer. The low temperature of the substrate, and the dielectric layer, can prevent relaxation of the dielectric layer during the first plasma exposure.

During the first plasma exposure, a fraction of atoms in the dielectric layer can be forced out of the film, while the rest of the atomic structure is not given a sufficient freedom to restructure or re-bind, thus leaving behind unsaturated dangling bonds. In some embodiments, the atomic structure does not restructured, meaning does not return to equilibrium state after the vacancy formation, e.g., due to the atoms removed from the film. For example, the temperature of the substrate can be kept at a low temperature to avoid self diffusion, e.g., migration of atoms to fill the vacancies due to thermal excitation.

The plasma conditions, e.g., the duration of the plasma pulse, can be selected to keep the probability to generate two neighboring vacancy defects low, for example, <~10% per defect. The plasma exposure can also be selected to generate a high overall number of vacancies, e.g., greater than 0.5 at % or much greater than 1 at %.

In some embodiments, additional treatment can be provided to ensure that the emitted ions from the dielectric layer are not re-adsorbed by the dielectric. The additional treatment can include a very low energy source of electronic or ionic plasma chosen to compensate the surface charging, and/or flushing with an inert gas, and/or providing a collection target connected to a high voltage source to collect the emitted ions.

In FIG. 4C, the dielectric layer 400 is then exposed to a second plasma bombardment 420. As shown in FIG. 4D, the second plasma exposure can fill the vacancies left by the first plasma exposure with the ions 425 in the second plasma exposure.

The second plasma exposure can include plasma ions that can fill the vacancy sites generated by the first plasma exposure. For example, the second plasma can include a very low-energy moderate-intensity plasma. The temperature of the second plasma ambient can be less than that of the first plasma ambient. The temperature of the plasma can be less than ~10,000K, or about between 2,000K and 10,000K. The second plasma ambient can include ion density less than that of the first plasma ambient. The second plasma ambient can include ions having kinetic energy less than or equal to 1 eV, and can be between 0.2 eV and 1 eV. The second plasma ambient can include ion density greater than or equal to $10^{-8}/cm^3$. The intensity of the plasma can be sufficiently small to ensure the local film temperature does not allow substantial self-diffusion.

In the second plasma exposure, the plasma ions can be captured by the vacancy sites, partially saturating or oversaturating the dangling bonds. The first and second plasma exposures can generate substitutional defects in concentration greatly exceeding thermodynamically allowed solubility limits. For example, by limiting the self diffusion of the impurities, and the limited number of nearest neighbor vacancies, the concentration of substitutional defects can be a function of the first and second plasma exposures. In some embodiments, the second plasma exposure can be sufficiently long to ensure maximum filling of the available vacancies by the plasma ions.

In some embodiments, the atomic structure does not restructured, meaning does not return to equilibrium state after the incorporation of atoms or ions. For example, the temperature of the substrate can be kept at a low temperature to avoid self diffusion, e.g., migration of the interstitial atoms or ions. For example, the plasma intensity can be configured so that the substrate heating due to plasma ion bombardment is below a substantially self diffusion temperature, such as below a fraction, e.g., one third or one half, of the melting temperature of the film. Alternatively, active substrate cooling can be performed for high intensity plasma to maintain the substrate at low temperature.

The process sequence can generate a large number of substitutional defects, e.g., nitrogen or phosphorous replacing oxygen, in concentrations sufficiently high to form an impurity band around the energy of the isolated impurity levels. In some embodiments, additional doping can be provided to ensure that the band is partially filled. For example, in the second plasma exposure, dopant atoms can be added to the impurity ion ambient, the second plasma ambient can include the impurity and the dopant atoms.

In some embodiments, the process, and the material, e.g., the dielectric layer, can be kept at temperatures below the temperature at which substantial self-diffusion sets in. This would ensure that the material does not re-bind to change the local atomic coordination, thereby preventing passivating or compensating the electrical signature of the generated impurities. For example, an anneal process can be provided after the formation of the dielectric layer, but can need to be optimized after the first or second plasma exposure.

In some embodiments, the above sequence can be repeated, for example, to form a thicker layer.

FIG. 5 illustrates a process flowchart for forming a conductive material having narrow conduction band according to some embodiments. In operation 500, a dielectric layer is provided on a substrate. The dielectric layer can be formed by a deposition process, such as an atomic layer deposition (ALD) process, a physical vapor deposition (PVD) process, a chemical vapor deposition (CVD) process, or any other processes. Treatments can be performed on the deposited dielectric layer, including an anneal process. The dielectric layer can include covalently bonded dielectric material, such as silicon dioxide.

In some embodiments, the dielectric layer can include materials having band gap energy greater than 2 eV, such as greater than 3.5 eV. The dielectric layer can include materials having stoichiometric compounds, e.g., having clear coordination number, which is defined by the available covalent bonds. The dielectric layer can have substantially uniform distribution of coordination number.

In some embodiments, the dielectric layer can be cooled, for example, to a temperature less than one third of the melting temperature of the dielectric layer.

In operation 510, the dielectric layer is exposed to a first plasma ambient. The first plasma ambient can have power configured to break the covalent bonds of the dielectric layer. The first plasma ambient can be configured to enable the removal of atoms by at least 1 at %, for example, between 1 at % and 10 at %. The first plasma ambient can be configured to not enabling the dielectric layer to restructure.

In some embodiments, the first plasma ambient can include plasma ions which enable the generation of impurity levels within the dielectric band gap. The first plasma ambient can include high temperature plasma having temperature greater than or equal to 50,000K. The first plasma ambient can include ions having kinetic energy greater than or equal to 5 eV. The first plasma ambient can include ion density less than or equal to $10^{-9}/cm^3$. The first plasma ambient can include ion density which is configured to not heating the dielectric layer to above one third of the melting temperature of the dielectric layer. The first plasma ambient can be configured to force a fraction of atoms in the dielectric layer out of the dielectric layer.

In operation 520, the dielectric layer is exposed to a first plasma ambient, after being subjected to the first plasma exposure. The second plasma ambient can include plasma ions which enable the capture of ions by the vacancy generated by the removal of the atoms due to the exposure to the first plasma ambient. The second plasma ambient can be configured to enable the capture of ions through the vacancies from in the previous step. The percentage of ion capturing can be between 50 and 100% of the vacancy sites. In some embodiments, the captured ions can form interstitial sites. The captured ions, e.g., substitutional ions and interstitial ions, can be at least 1 at %, such as between 1 and 10 at %.

The second plasma ambient can include power which is configured to not enabling self diffusion of the captured ions In some embodiments, wherein the second plasma ambient can include low temperature plasma having temperature lower than the first plasma ambient. The second plasma ambient can include low temperature plasma having temperature lower than or equal to 10,000K. The second plasma ambient can include ions having kinetic energy less than or equal to 1 eV. The second plasma ambient can include ion density greater than that of the first plasma ambient. The second plasma ambient can include ion density greater than or equal to $10^{-8}/cm^3$. The second plasma ambient can include ion density which is configured to not heating the dielectric layer to above one third of the melting temperature of the dielectric layer. The second plasma ambient can include ion density which is configured to not enabling self diffusion of the captured ions.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A conductive material comprising:
a dielectric material and a substitutional impurity,
wherein a concentration of the substitutional impurity in the conductive material is between about 0.5 atomic % and 3 atomic %,
wherein the concentration of the substitutional impurity exceeds a thermodynamic solubility limit of the dielectric material,
wherein a first atomic structure of the conductive material is same as a second atomic structure of the dielectric material,
wherein the dielectric material has a band gap energy of greater than 2 eV,
wherein the substitutional impurity forms an impurity conduction band within the conductive material,
wherein the impurity conduction band is positioned at an energy level within the band gap energy, and
wherein the impurity conduction band is narrower than 5 eV.

2. The conductive material of claim 1, wherein the dielectric layer material comprises silicon dioxide.

3. The conductive material of claim 1, wherein the substitutional impurity does not undergo restructuring.

4. The conductive material of claim 1, wherein the substitutional impurity comprises at least one of nitrogen or phosphorous.

5. The conductive material of claim 1, wherein the dielectric material comprises silicon dioxide ($SiO_2$), and wherein the substitutional impurity comprises phosphorous.

6. The conductive material of claim 1, wherein the impurity conduction band is narrower than a conduction band of at least one of aluminum or copper.

7. The conductive material of claim 1, wherein the dielectric material has a band gap energy greater than 3 eV.

8. The conductive material of claim 1, wherein the dielectric material has a band gap energy greater than 4 eV.

9. The conductive material of claim 1, wherein the dielectric material is a stoichiometric compound.

10. The conductive material of claim 9, wherein the stoichiometric compound has a clear coordination number.

11. The conductive material of claim 10, wherein the stoichiometric compound has a uniform distribution of the coordination number.

12. The conductive material of claim 1, wherein the dielectric material is a covalently bonded dielectric material.

13. A transistor device comprising:
a source region;
a drain region; and
a gate electrode disposed between the source region and the drain region,
wherein the gate electrode comprises a gate dielectric and a gate conductor,
wherein the gate conductor comprises a dielectric material and a substitutional impurity;
wherein a concentration of the substitutional impurity in the gate conductor is between about 0.5 atomic % and 3 atomic %,
wherein the concentration of the substitutional impurity exceeds a thermodynamic solubility limit of the dielectric material,
wherein a first atomic structure of the gate conductor is same as a second atomic structure of the dielectric material,
wherein the dielectric material has a band gap energy of greater than 2 eV,
wherein the substitutional impurity forms an impurity conduction band within the gate conductor,
wherein the impurity conduction band is positioned at an energy level within the band gap energy, and
wherein the impurity conduction band is narrower than 5 eV.

14. The transistor device of as in claim 13, wherein the dielectric material layer comprises silicon dioxide.

15. The transistor device of claim 13, wherein the impurities do not undergo restructuring.

16. The transistor device of claim 13, wherein the substitutional impurity comprises at least one of nitrogen or phosphorous.

17. The transistor device of claim 13, further comprising a metal interconnect formed for connecting the gate electrode, the source region, and the drain region.

18. The conductive material of claim 5, wherein the dielectric material comprises silicon dioxide ($SiO_2$), and wherein the substitutional impurity comprises nitrogen.

* * * * *